United States Patent [19]

Tanaka et al.

[11] Patent Number: 4,954,866
[45] Date of Patent: Sep. 4, 1990

[54] SEMICONDUCTOR INTEGRATED CIRCUIT MEMORY

[75] Inventors: Hirotoshi Tanaka, Yamanashi; Hiroki Yamashita, Hachioji; Noboru Masuda, Kokubunji; Junji Shigeta, Fuchu; Yasunari Umemoto, Tokorozawa; Osamu Kagaya, Kokubunji, all of Japan

[73] Assignee: Hitachi, Ltd., Tokyo, Japan

[21] Appl. No.: 247,250

[22] Filed: Sep. 21, 1988

[30] Foreign Application Priority Data

Sep. 24, 1987 [JP] Japan .................. 62-237130

[51] Int. Cl.$^5$ .................. H01L 27/10; H01L 29/80; H01L 27/04
[52] U.S. Cl. .................. 357/45; 357/22; 357/48
[58] Field of Search .................. 357/22, 45, 84

[56] References Cited

FOREIGN PATENT DOCUMENTS

| 107278 | 8/1979 | Japan | 357/42 |
|---|---|---|---|
| 148451 | 9/1983 | Japan | 357/22 |
| 207056 | 9/1986 | Japan | 357/45 |
| 125709 | 6/1987 | Japan | |

OTHER PUBLICATIONS

Takano et al. "Fast SRAMs" 1987 IEEE International Solid-State Circuits Conference, pp. 140–141, 371.
Umemoto et al., "Effects of a Buried p–Layer on Alpha–Particle Immunity of MESFETs . . . " IEEE Electron Device Letters, vol. EDL-7, No. 6, Jun. 1986, pp. 396–397.

Primary Examiner—Rolf Hille
Assistant Examiner—Robert P. Limanek
Attorney, Agent, or Firm—Antonelli, Terry, Stout & Kraus

[57] ABSTRACT

A semiconductor integrated circuit memory is disclosed in which a first impurity-doped layer for making circuit elements such as MESFET's and a second impurity-doped layer opposite in conductivity type to the first impurity-doped layer are formed in a semi-insulating substrate in such a manner that the second impurity-doped layer is formed under and between circuit elements for making up a memory cell array part and a peripheral circuit part, and is divided into at least first and second regions. For example, the first region formed under and between the circuit elements of the memory cell array part is made of a P-type layer which is high in carrier density, and the second region formed under and between the circuit elements of the peripheral circuit part is made of a P-type layer which is low in carrier density. The high carrier-density P-type layer formed under the memory cell array part allows a memory cell having a minimum critical charge for alpha-particles to gain satisfactory alpha-particle immunity even when the memory cell is made fine in size. Further, the low carrier-density P-type layer formed under the peripheral circuit part having a critical charge larger than that of the memory cell can improve the alpha-particle immunity of the peripheral circuit part and can suppress an increase in parasitic capacitance at the peripheral circuit part to maintain the high-speed operation of the memory.

25 Claims, 6 Drawing Sheets

SEMICONDUCTOR INTEGRATED CIRCUIT MEMORY

BACKGROUND OF THE INVENTION

The present invention relates to a semiconductor integrated circuit memory, and more particularly to a semiconductor integrated circuit memory made of GaAs which is a compound semiconductor. In more detail, the present invention relates to a semiconductor LSI memory (namely, a semiconductor large scale integration circuit memory) which includes very fine memory cells and is excellent in alpha-particle immunity.

In the past, little attention has been paid to the alpha-particle immunity of a GaAs LSI. For example, as described in the IEEE, International Solid-State Circuits Conference Digest of Technical Papers Volume XXX, 1987, pages 140 and 141, MESFET's (hereinafter referred to as "FET's") and other circuit elements are formed directly a semi-insulating GaAs substrate, and the alpha-particle immunity of the GaAs LSI and the counterplan thereto are not considered.

However, as described in the IEEE, Electron Device Letter, Vol. EDL-7, No.6, June 1986, pages 396 and 397, when an FET formed on a GaAs substrate is irradiated with alpha-particles, an electric charge of about 800 fc is generated in the FET, and this value is several times greater than a value expected from the energy of the alpha-particles. Further, when a P-type layer opposite in conductivity type to an N-channel of the FET is formed beneath the bottom of the FET, the charge generated in the FET is reduced to about 100 fc which is a fraction of the above value. An example of a GaAs LSI which includes a P-buried layer, is described on pages 138 and 139 of the above-referred IEEE International Solid-State Circuits Conference Digest of Technical Papers, 1978. In this example, the P-buried layer is formed all over a GaAs LSI under the same manufacturing conditions, and the dosage in forming the P-buried layer through ion implantation techniques is as high as about $2 \times 10^{12}$ cm$^{-2}$.

Unfortunately, if it is intended to improve the alpha-particle immunity of an LSI memory including a very small memory cell made by employing this example, the operation speed of the LSI memory will be reduced. This is the case since it requires an increase in the amount of the ion implanting dosage into the P-type layer which changes the P-type layer from being a depleted layer to a conductive layer and produces parasitic capacitance.

SUMMARY OF THE INVENTION

It is an object of the present invention to provide a semiconductor integrated circuit memory, in which the alpha-particle immunity of each of memory cells made fine in size can be improved without reducing the operation speed of the integrated circuit memory.

In order to attain the above object, according to the present invention, there is provided a semiconductor integrated circuit memory, in which a multiplicity of circuit elements are made of a first impurity-doped layer formed in a semi-insulating substrate at a multiplicity of positions, with a plurality of memory cells arranged in the form of a matrix being constructed of a part of the circuit elements to make up a memory cell array part, and with a peripheral circuit part for selecting a desired one of the memory cells and for performing write and read operations for the desired memory cell being made up of the remaining part of the circuit elements. A second impurity-doped layer opposite in conductivity type to the first impurity-doped layer is formed under and between the circuit elements for making up the memory cell array part and the peripheral circuit part, and is divided into at least first and second regions different in impurity concentration from each other.

In more detail, the first region formed under and between the circuit elements of the memory cell array part is a P-type layer which is high in carrier density, and the second region formed under and between the circuit elements of the peripheral circuit part is a P-type layer which is low in carrier density.

The high carrier-density P-type layer for the memory cell array part makes it possible to maintain the alpha-particle immunity of a memory cell which has a low critical charge level for alpha-particles, even when the memory cell is made fine. The term "critical charge" will be explained later.

While, the low carrier-density P-type layer for the peripheral circuit part having a critical charge larger than that of a memory cell can improve the alpha-particle immunity of the peripheral circuit part, and moreover can suppress an increase in parasitic capacitance. Thus, the low carrier-density P-type layer makes it possible to maintain the high-speed operation of the integrated circuit memory.

As mentioned above, according to the present invention, the alpha-particle immunity of each memory cell which determines that of the whole of an integrated circuit memory, can be improved, and moreover an increase in parasitic capacitance at a peripheral circuit part can be suppressed. Thus, a high integration-density memory including memory cells made fine in size can gain satisfactory alpha-particle immunity, and moreover can perform a high-speed operation.

Further, the threshold voltage $V_{th}$ of each of FET's for forming a memory cell can be varied by applying an electric potential to the high carrier-density P-type layer for the memory cell array part. Such an operation can be used for compensating a change in threshold voltage $V_{th}$ due to variations in the fabricating process, and makes it possible to simultaneously form an ion-implanted layer which is used for making depletion type FET's included in the peripheral circuit part, and another ion-implanted layer which is used for making enhancement type FET's making up a memory cell. Thus, the manufacturing process of an integrated circuit memory can be simplified.

Further, it is not always required that the whole of the first region for the memory cell array part is a high carrier-density P-type layer. Instead portions of the first region may be made different in impurity concentration from the remaining portion of the first region so that the first region partly becomes a low-carrier-density P-type layer. For example, the first region may be formed in such a manner that the high carrier-density P-type layer is formed under and between those ones of circuit elements making up a memory cell which are used for forming a flip-flop circuit, and the low carrier-density P-type layer is formed under and around transfer FET's included in the memory cell. Further, it is not always required that the whole of the second region for the peripheral circuit part is a low carrier-density P-type layer, but portions of the second region may be made different in impurity concentration from the remaining portion of the second region so that the second region partly becomes a high carrier-density P-type layer. For example, the second region formed under the circuit elements of the peripheral circuit part may be made different in impurity concentration from the second region formed between the above circuit elements so that the alpha-particle immunity of the peripheral circuit part is improved. Further, a high carrier-density P-type layer may be formed under and between circuit elements included in the peripheral circuit part for forming a bistable circuit which has the same circuit configuration as the flip-flop circuit of the memory cell, to improve the alpha-particle immunity of the bistable circuit of the peripheral circuit part.

BRIEF DESCRIPTION OF THE DRAWINGS

FIG. 2 shows a relationship between the dosage of a P-type impurity and the collected charge at an FET, FIG. 3 shows the critical charge at various circuit parts of an LSI memory, FIG. 4 shows the circuit configuration of a 6-transistor memory cell, FIG. 5 shows a relationship between the gate width of a driving FET and the critical charge of a memory cell, and FIG. 6 shows a relationship between the dosage of a P-type impurity and the collected charge at an FET, and a relationship between the dosage of the P-type impurity and the junction capacitance at a PN junction.

DESCRIPTION OF THE PREFERRED EMBODIMENTS

Prior to the explanation of the preferred embodiments, problems which have to be solved by the present invention, will be described. At first, explanation will be made of a problem which arises in forming a P-type layer under an FET having an N-channel.

Figure 2:
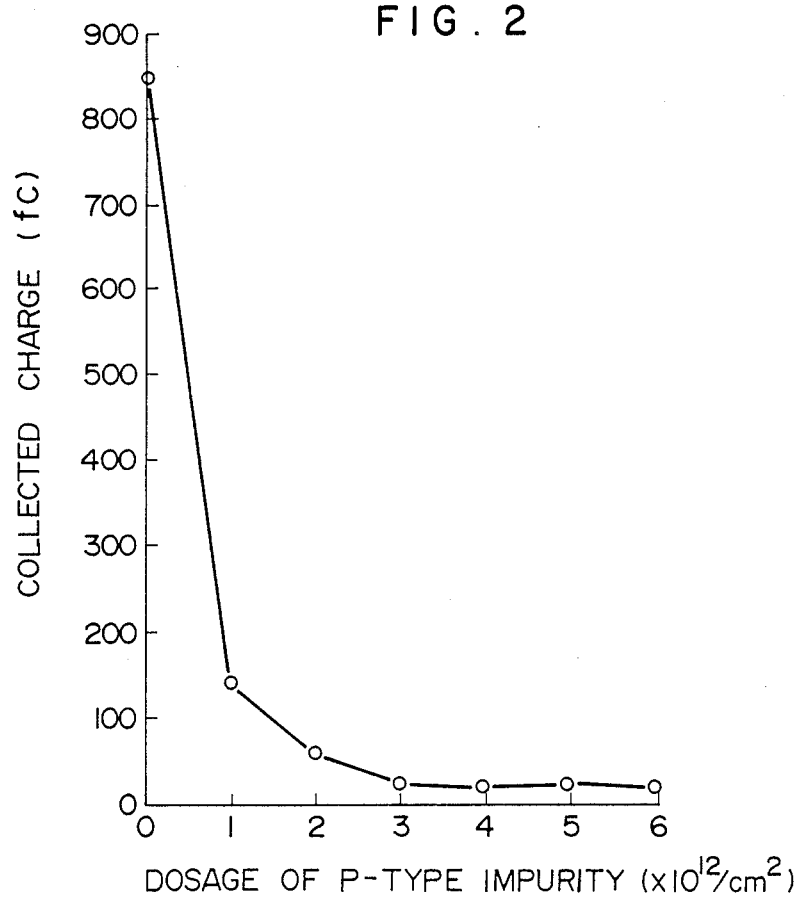
FIGS. 2 to 6 are diagrams for explaining problems which have to be solved by the present invention.

When the P-type layer is formed under the FET in such a manner that a P-type impurity ion is implanted in a substrate at an implant energy of 400 KeV and a dosage of $2 \times 10^{12}$ cm$^{-2}$, the electric charge which is collected at the FET on the basis of the irradiation of the FET with alpha-particles is about 60 fc as shown in FIG. 2. Hence, when each memory cell included in a semiconductor integrated circuit memory is made very fine in size to increase the integration density of the memory, there is a fear of generating the so-called soft error due to alpha-particles.

Figure 3:
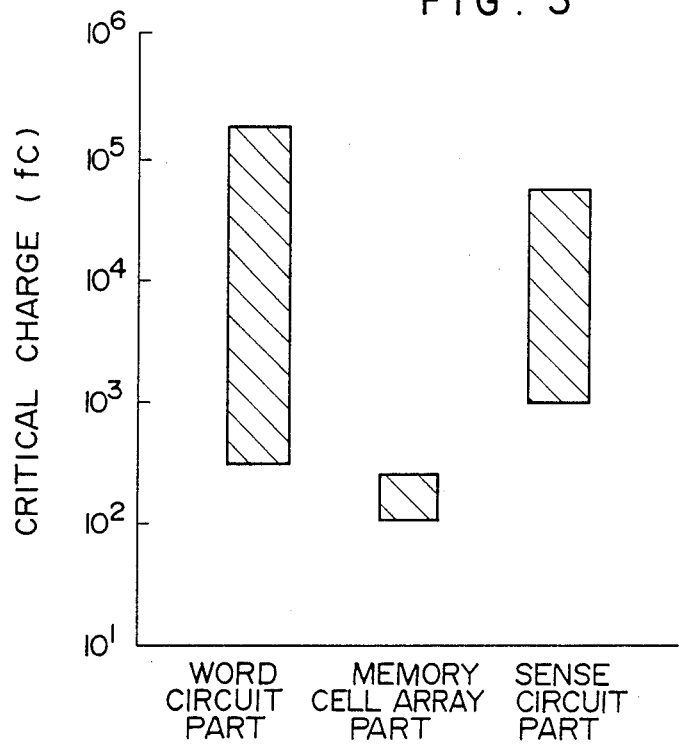

FIG. 3 shows a critical charge (namely, a minimum collected charge capable of generating a malfunction) at three circuit parts of a LSI memory, that is, a word circuit part, a memory cell array part and a sense circuit part. It is to be noted that the critical charge shown in FIG. 3 is obtained, by a simulation method, for an LSI memory which does not include the P-buried layer and has three circuit parts (namely, the word circuit part, the memory cell array part and the sense circuit part) formed under the same manufacturing conditions. As can be seen from FIG. 3, the memory cell array part is smaller in critical charge than the word circuit part and the sense circuit part. Hence, when bombarded with alpha-particles, the memory cell array part readily performs a malfunction. Further, even in a case where a malfunction is caused by alpha-particles in the peripheral circuit part including the word circuit part and the sense circuit part, the malfunction is temporarily generated, and a normal operation is restored when a predetermined time has elapsed after the malfunction was generated. While, a memory cell includes a flip-flop circuit. When an electric charge is generated in the flip-flop circuit by alpha-particles, the state of the flip-flop circuit is reversed, and thus uncorrect information is stored therein. In order to return the malfunction of the flip-flop circuit to a normal operation, it is necessary to rewrite information in the flip-flop circuit. That is, the flip-flop circuit is affected by the alpha-particle in a great degree.

Figure 4:
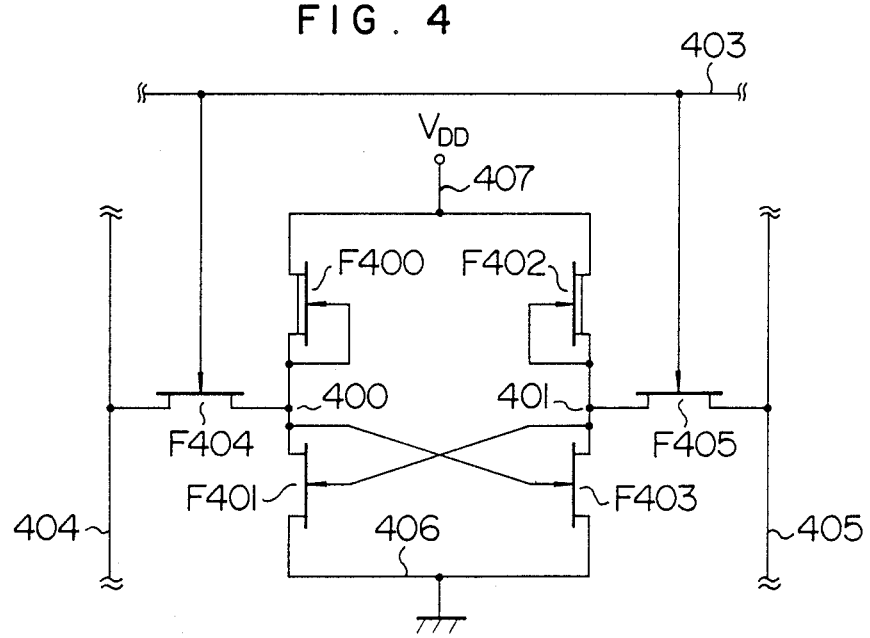

FIG. 4 shows the circuit configuration of a 6-transistor memory cell which is usually used in a GaAs LSI memory. Referring to FIG. 4, a memory cell includes a flip-flop circuit formed of FET's F400 to F403, and transfer FET's F404 and F405. Information is stored at nodes 400 and 401. Read and write operations for the memory cell are performed in a state that a word line 403 is put to a high level and thus the transfer FET's 404 and 405 are put in an ON state. Now, let us consider a case where the nodes 400 and 401 are kept at high and low levels, respectively, and the alpha-particle impinges on the FET F401. The FET F401 is temporarily put in the ON-state. Hence, the level of the node 400 is changed from the high level to the low level, and thus the level of the node 401 is changed from the low level to the high level. As a result, the stored information is reversed in polarity. It depends upon the electric charge collected at the node 400 whether or not the above destruction of information occurs, and the electric charge on the node 400 is given by the product of the capacitance with respect to the node 400 and a voltage applied thereto (that is, about 0.5 V). The capacitance with respect to the node 400 includes the gate capacitance of the FET F403, the parasitic capacitance of the FET's F401 and F404, and the capacitance of wiring connected between these FET's. In order to increase the integration density of an LSI memory in the future, it is necessary to make each memory cell small in size. Hence, it will be required to make small the gate length and gate width of each FET and the width of the wiring. That is, the capacitance with respect to the node 400 will be reduced.

Figure 5:
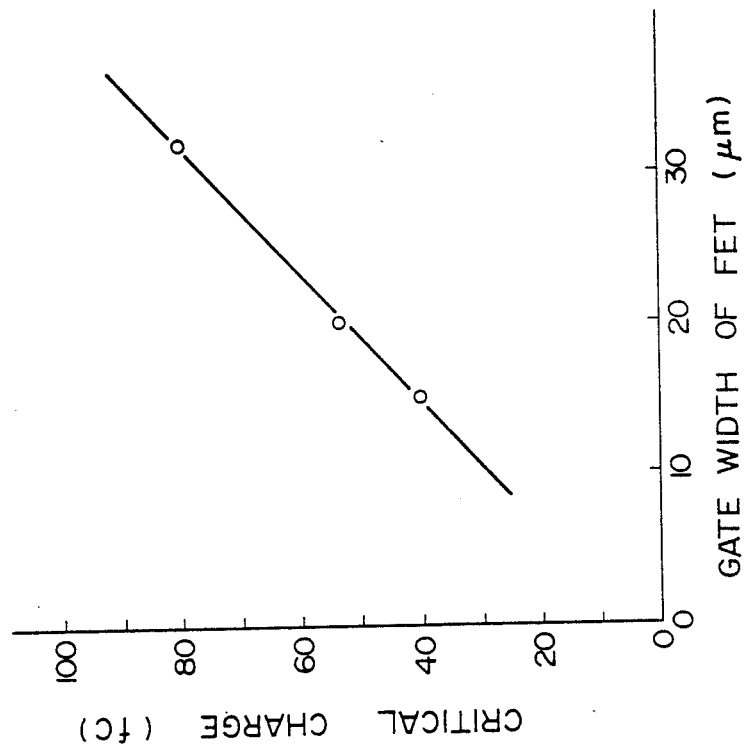

FIG. 5 shows a relationship between the gate width of a driving FET for forming the flip-flop circuit of a memory cell and the critical charge. It is to be noted that the relationship of FIG. 5 has been obtained by the simulation method for a case where the gate width of the driving FET is of the order of submicrons. When the gate width of the driving FET is made less than 20 $\mu$m, the critical charge of the memory cell becomes less than 60 fc. As can be seen from FIG. 2, the collected charge in a case where the P-buried layer is formed through ion implantation techniques at a dosage of $2\times10^{12}$ cm$^{-2}$, is greater than the above critical charge, and thus a malfunction is caused by the alpha-particle.

Figure 6:
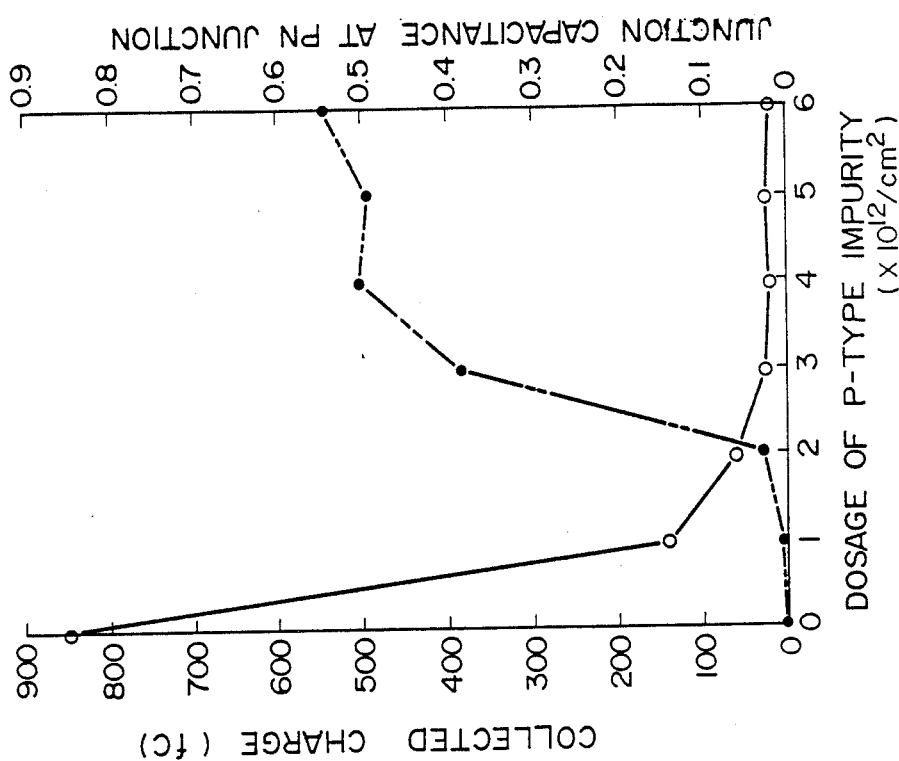

In order to avoid the malfunction, as can be seen from FIG. 2, it is desirable to increase the dosage which is used in forming the P-buried layer through ion implantation techniques. However, when the dosage for forming the P-buried layer is made greater than $2\times10^{12}$ cm$^{-2}$, the junction capacitance at a PN junction increases abruptly as shown in FIG. 6. In other words, the P-buried layer is changed from a depletion layer low in carrier density to a conductive layer high in carrier density, and thus the junction capacitance is newly generated between an N-type layer used as the channel of an FET and the source and drain regions thereof, and the P-buried layer. This junction capacitance acts as the load capacitance of the FETs. Thus, an access time to a memory cell is increased, and the performance characteristics of an LSI memory are greatly degraded.

As mentioned above, in a case where each memory cell is made very small in size to increase the integration density of an LSI memory, when the alpha-particle immunity of each memory cell is improved by increasing the impurity concentration of the P-buried layer, the operation speed of the LSI memory is lowered. In view of the above fact, according to the present invention, an impurity-doped layer opposite in conductivity type from another impurity-doped layer for making circuit elements is formed under and between the circuit elements making up a memory cell array part and a peripheral circuit part, and the impurity-doped layer formed under and between the circuit elements of the memory cell array part is different in impurity concentration from the impurity-doped layer formed under and between the circuit elements of the peripheral circuit part. For example, a high carrier-density P-type layer is formed under and between the circuit elements of the memory cell array part and a low carrier-density P-type layer substantially equal to a depletion layer is formed under and between the circuit elements of the peripheral circuit part, to improve the alpha-particle immunity of each memory cell without reducing the operation speed of an LSI memory.

Now, explanation will be made of an embodiment of a semiconductor integrated circuit memory according to the present invention, with reference to FIG. 1.

Figure 1:
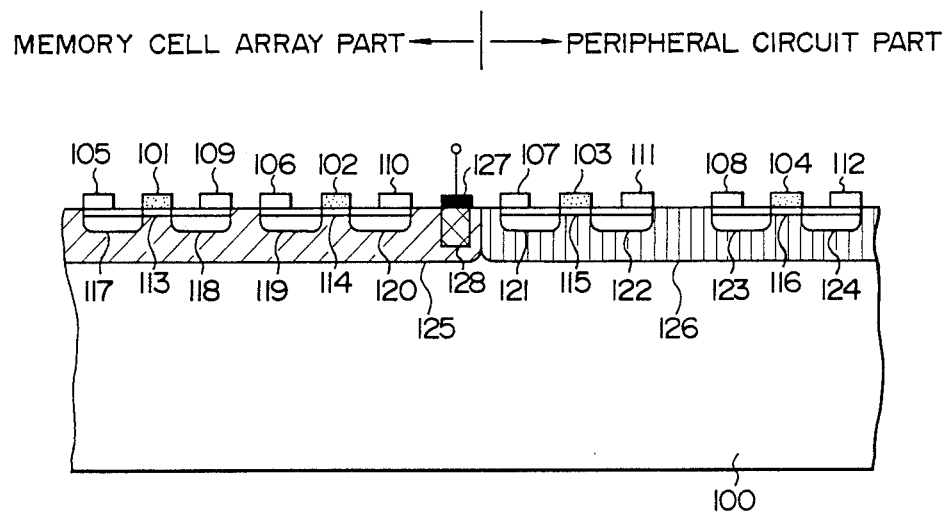
FIG. 1 is a sectional view showing an embodiment of a semiconductor integrated circuit memory according to the present invention.

In FIG. 1, reference numeral 100 designates a semi-insulating GaAs substrate, 101 and 102 the gate electrodes of two FET's for forming a memory cell, 103 and 104 the gate electrodes of two FET's for forming a peripheral circuit, 105 and 106 the source electrodes of the FET's for forming the memory cell, 107 and 108 the source electrodes of the FET's for forming the peripheral circuit, 109 and 110 the drain electrodes of the FET's for forming the memory cell, 111 and 112 the drain electrodes of the FET's for forming the peripheral circuit, 113 and 114 N-channel layers for forming the memory cell, 115 and 116 N-channel layers for forming the peripheral circuit, 117 to 120 a highly-doped N-type layer kept in ohmic contact with the source and drain electrodes of each of the FET's for forming the memory cell, 121 to 124 a highly-doped N-type layer kept in ohmic contact with the source and drain electrodes of each of the FET's for forming the peripheral circuit, 125 a high carrier-density P-type layer, 126 a low carrier-density P-type, 127 an electrode for applying a predetermined potential to the P-type layer 125, and 128 a highly-doped P-type layer kept in ohmic contact with the P-layer 125 and the electrode 127. It is to be noted that in order to improve the alpha-particle immunity of an isolation region formed between adjacent FET's, the P-type layers 125 and 126 are formed not only under FET's but also between the FET's.

According to the present embodiment, the high carrier-density P-type layer 125 is formed under a memory cell through ion implantation techniques at a dosage more than $2\times10^{12}$ cm$^{-2}$. Accordingly, the alpha-particle immunity of the memory cell is greatly improved. While, the low carrier-density P-type layer 126 is formed under a peripheral circuit part through ion implantation techniques at a dosage less than $2\times10^{12}$ cm$^{-2}$. Accordingly, the alpha-particle immunity of the peripheral circuit part is improved without increasing the parasitic capacitance in the peripheral circuit part.

Figure 7:
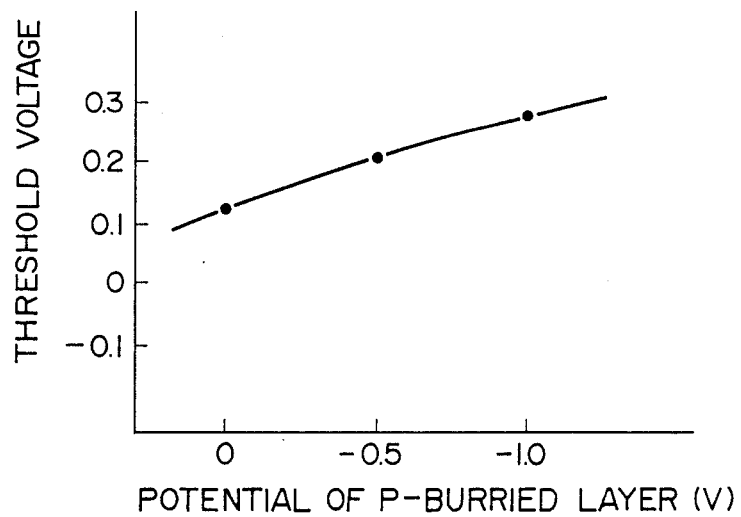
FIG. 7 is a graph showing a relationship between the electric potential of a P-buried layer and the threshold voltage of an FET.

By using the above structure, an LSI memory including memory cells made fine in size can gain satisfactory alpha-particle immunity while making an increase in parasitic capacitance as small as possible. Further, as shown in FIG. 7, the threshold voltage $V_{th}$ of an FET formed on the P-type layer 125 can be varied by a potential applied to the electrode 127. The application of a potential to the electrode 127 makes it possible to compensate a change in threshold voltage $V_{th}$ due to variations in fabricating process, and to make both FET's for forming a memory cell and FET's for forming a peripheral circuit through ion implantation techniques at the same dosage of an N-type impurity.

Further, it is possible to form a P-type layer only under the memory cell array part which is small in critical charge. In this case, however, the collected charge at the peripheral circuit part due to the alpha-particle exceeds 800 fc, as shown in FIG. 2. Thus, as shown in FIG. 3, the word circuit part included in the peripheral circuit part cannot gain satisfactory alpha-particle immunity. Further, the P-type layer does not only improve the alpha-particle immunity of a circuit element, but also can prevent an abrupt decrease in threshold voltage $V_{th}$ of an FET caused by reducing the gate length of the FET less than 1 μm (that is, the short channel effect of the FET). Accordingly, in a case where each memory cell is made very small in size, it is very important to form a P-type layer in the whole region of a wafer or chip as shown in FIG. 1.

Figure 8:
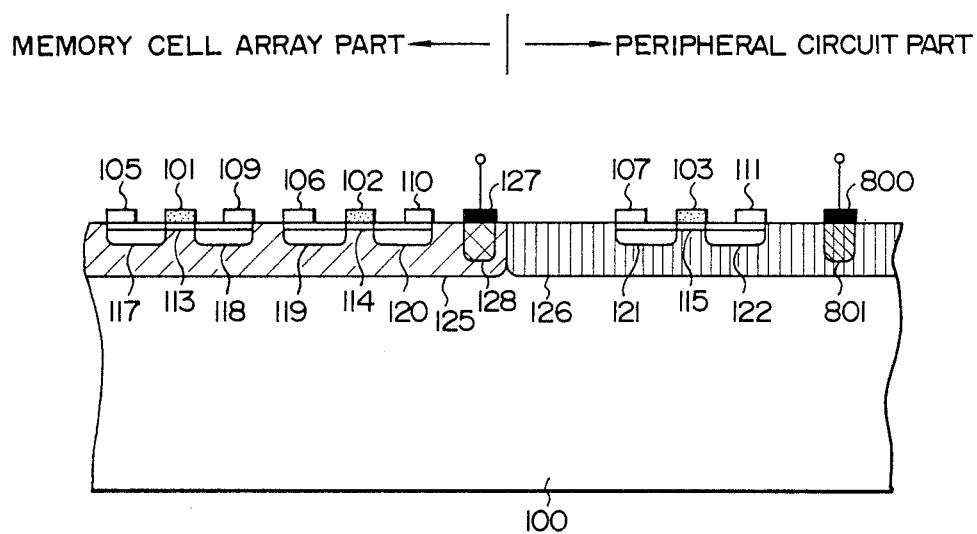
FIGS. 8 and 9 are sectional views showing another and a further embodiments of a semiconductor integrated circuit memory according to the present invention.

FIG. 8 shows another embodiment of a semiconductor integrated circuit memory according to the present invention. In the present embodiment, the P-type layer 125 for the memory cell array part and the P-type layer 126 for the peripheral circuit part are both made high in impurity concentration, and an electrode 800 and a highly-doped P-type layer 801 are additionally formed to apply an electric potential to the P-type layer 126. A negative potential is applied to the electrode 800, to reduce the carrier density of the P-type layer 126. Thus, the present embodiment can exhibit the same effect as the embodiment of FIG. 1.

Figure 9:
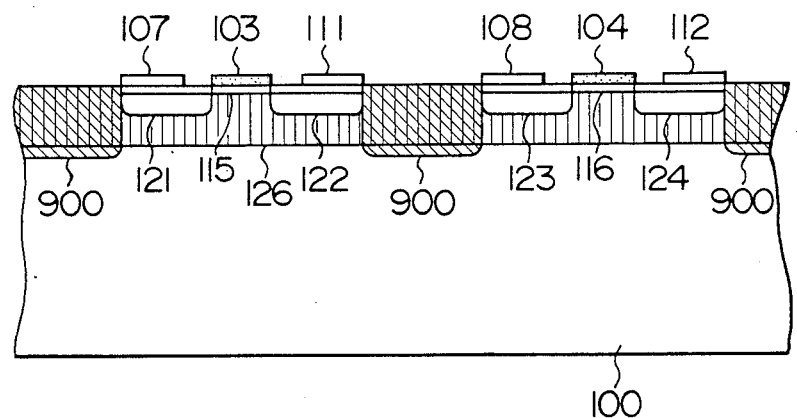

FIG. 9 shows the peripheral circuit part of a further embodiment of a semiconductor integrated circuit memory according to the present invention. In the peripheral circuit part of the present embodiment, the impurity concentration of a P-type layer 900 formed between FET's is made different from the impurity concentration of the P-type layer 126 formed under the FET's, to optimize the alpha-particle immunity of the peripheral circuit part.

Figure 10:
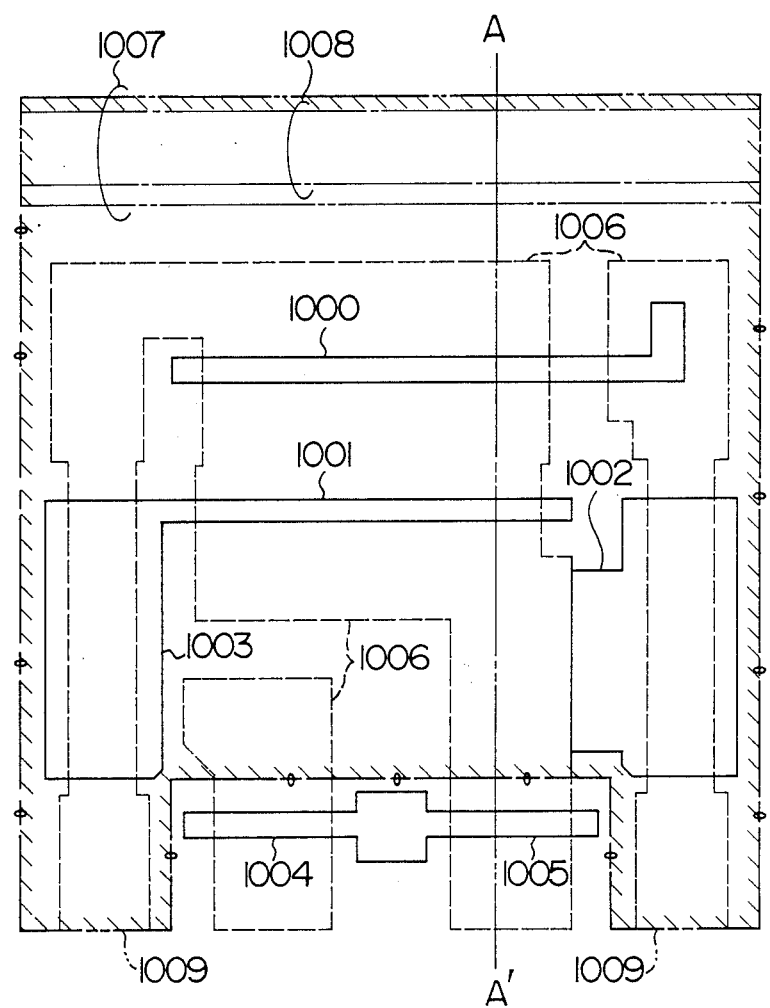
FIG. 10 is a plan view showing an example of the layout of FET's at each memory cell of a semiconductor integrated circuit memory according to the present invention.

FIG. 10 is a plan view which shows an example of the layout of FET's in a memory cell viewed from above an LSI chip. Referring to FIG. 10, gate electrode 1000, 1001, 1002, 1003, 1004 and 1005 correspond to the gate electrodes of the FET's F401, F403, F402, F400, F404 and F405 of FIG. 4, respectively. Further, in FIG. 10, reference numeral 1006 designates highly-doped N-type layer for forming N-channel layers and source and drain ohmic contact regions, 1007 a highly-doped P-type layer corresponding to the layer 128 of FIG. 1, 1008 an electrode corresponding to the electrode 127 of FIG. 1, and 1009 a high carrier-density P-type layer corresponding to the layer 125 of FIG. 1. It is to be noted that only the gate electrodes and the N- and P-ion implanted layers are shown in FIG. 10 for the sake of simplicity. In order to make an increase in parasitic capacitance due to the high carrier-density P-type layer as small as possible, a low carrier-density P-type layer is formed under and around the gate electrodes 1004 and 1005 of the transfer FET's F404 and F405 as shown in FIG. 10, since there is little fear of the malfunction of the transfer FET's due to alpha-particles. That is, it is not required to form the high carrier-density P-type layer under the whole region of a memory cell, but the low carrier-density P-type layer may be formed under a part of the memory cell.

Figure 11:
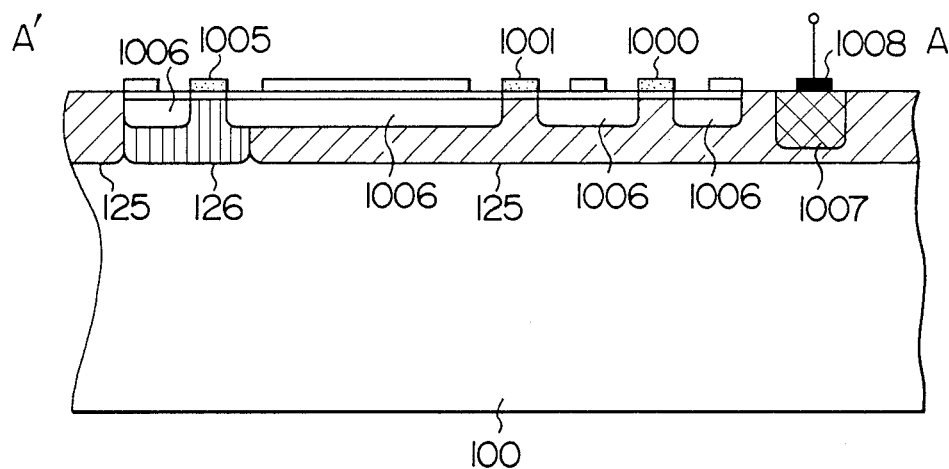
FIG. 11 is a sectional view taken along the line A-A' of FIG. 10.

FIG. 11 is a sectional view taken along the line A-A' of FIG. 10. As shown in FIG. 11, the low carrier-density P-type layer 126 is formed under and around the gate electrode 1005 of the transfer FET F405 which is scarcely affected by the alpha-particle, and thus an increase in parasitic capacitance due to the high carrier-density P-type layer 125 is prevented from occurring at the highly-doped N-type layer 1006 which exists on the P-type layer 126.

Additional capacitance for improving the alpha-particle immunity of a memory cell is not shown in FIG. 10. Such additional capacitance may be formed in the memory cell. Referring back to FIG. 4, the additional capacitance can be formed between nodes 400 and 406, between nodes 401 and 406, between nodes 400 and 407, between nodes 401 and 407, or between nodes 400 and 401 in such a manner that junction capacitance or parallel plate capacitance using wiring layers are formed.

In the above-mentioned embodiments, the impurity concentration of the P-type layer for the memory cell array part is made different from the impurity concentration of the P-type layer for the peripheral circuit part. However, the impurity concentration of a portion of the P-type layer for the peripheral circuit part may be made different from the impurity concentration of the remaining portion, or a portion and the remaining portion of the P-type layer for the peripheral circuit part may be the high carrier-density P-type layer and the low carrier-density P-type layer, respectively.

Figure 12:
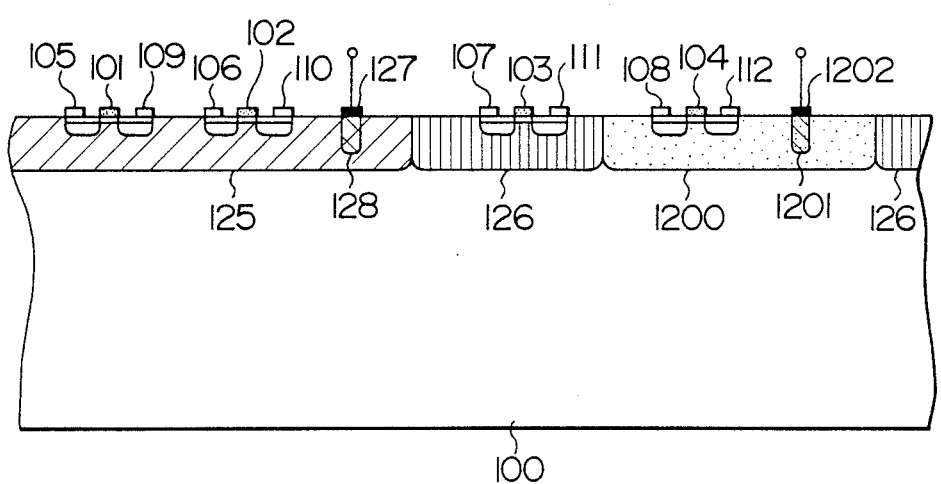
FIG. 12 is a sectional view showing a different embodiment of a semiconductor integrated circuit memory according to the present invention.

FIG. 12 shows a different embodiment of a semiconductor integrated circuit memory according to the present invention. Referring to FIG. 12, the low carrier-density P-type layer 126 is formed under an FET having a gate electrode 103, a high carrier-density P-type layer 1200 is formed under an FET having a gate electrode 104, a highly-doped P-type layer 1201 is kept in ohmic contact with the P-type layer 1200 and an electrode 1202, and the electrode 1202 is applied with a predetermined potential to control the threshold voltage $V_{th}$ of the FET having the gate electrode 104. By changing a portion 1200 of the low carrier-density P-type layer 126 for the peripheral circuit part to the high carrier-density P-type layer as mentioned above, it is possible to improve the alpha-particle immunity of a bistable circuit which is included in the peripheral circuit part and has the same circuit construction as the flip-flop circuit of a memory cell.

In the foregoing explanation, an N-channel layer is formed in each FET, and a P-buried layer is formed to improve the alpha-particle immunity of a memory. Alternatively, a P-channel layer and an N-buried layer may be formed.

In the explanation of the embodiments of FIGS. 1 and 8, an electric potential is applied to each of the electrodes 127 and 800. Alternatively, as described in a Japanese patent application No. JP-A-62-125,709, it is possible to connect the output signal of the monitor circuit which detects the threshold voltage $V_{th}$ of FET's formed on the same chip to the electrode 127 or 800 so that the threshold voltage of FET's included memory cell array and peripheral circuits becomes equal to a designed value.

As has been explained in the foregoing, according to the present invention, the alpha-particle immunity of a memory cells made fine in size can be improved without increasing the parasitic capacitance in a peripheral circuit part. Thus, an LSI memory can be obtained which is high in integration density, high in operation speed, and excellent in alpha-particle immunity.

We claim:

1. A semiconductor integrated circuit memory comprising:
   a memory cell array part having a plurality of memory cells arranged in the form of a matrix;
   a peripheral circuit part for selecting a desired one of the memory cells to perform read and write operations for the desired memory cell; and
   an impurity-doped layer formed under and between circuit elements making up the memory cell array part and the peripheral circuit part, the impurity-doped layer being opposite in conductivity type to another impurity-doped layer for making the circuit elements, the impurity-doped layer formed under and between the circuit elements of the memory cell array part being different in impurity concentration from the impurity-doped layer formed under and between the circuit elements of the peripheral circuit part.

2. A semiconductor integrated circuit memory according to claim 1, wherein the impurity-doped layer formed under and between the circuit elements of the memory cell array part has a predetermined high carrier density, and the impurity-doped layer formed under and between the circuit elements of the peripheral circuit part has a predetermined low carrier density.

3. A semiconductor integrated circuit memory according to claim 1, wherein the impurity-doped layer for making the circuit elements is an N-type layer, and the impurity-doped layer formed under and between the circuit elements is a P-type layer.

4. A semiconductor integrated circuit memory according to claim 3, wherein the P-type layer for the memory cell array part is formed through ion implantation techniques at a dosage greater than about $2 \times 10^{12}$ cm$^{-2}$, and the P-type layer for the peripheral circuit part is formed through ion implantation techniques at a dosage less than about $2 \times 10^{12}$ cm$^{-2}$.

5. A semiconductor integrated circuit memory according to claim 1, wherein at least one electrode is kept in ohmic contact with the impurity-doped layer formed under and between the circuit elements of the memory cell array part.

6. A semiconductor integrated circuit memory according to claim 5, wherein the electrode is applied with an electric potential to control the threshold voltage of the circuit elements of the memory cell array part.

7. A semiconductor integrated circuit memory according to claim 1, wherein the impurity-doped layer formed under and between the circuit elements of the peripheral circuit part has a predetermined high carrier density, wherein at least one electrode is kept in ohmic contact with said impurity-doped layer for the peripheral circuit part, and wherein the electrode is applied with a reverse bias potential to reduce the carrier density of said impurity-doped layer for the peripheral circuit part.

8. A semiconductor integrated circuit memory according to claim 1, wherein the impurity-doped layer formed under and between the circuit elements of the peripheral circuit part has a predetermined high carrier density in a portion having circuit elements arranged to form a flip-flop circuit, wherein at least one electrode is kept in ohmic contact with that portion of said impurity-doped layer for the peripheral circuit part having said predetermined high carrier density in carrier density, and wherein the electrode is applied with an electric potential to control the threshold voltage of a circuit element formed on the portion having said predetermined high carrier density.

9. A semiconductor integrated circuit memory according to claim 1, wherein the impurity-doped layer formed under and between the circuit elements of the memory cell array part has a predetermined high carrier density in a portion having circuit elements arranged to form a flip-flop circuit, wherein at least one electrode is kept in ohmic contact with that portion of said impurity-doped layer for the memory cell array part having said predetermined high carrier density, and wherein the electrode is applied with an electric potential to control the threshold voltage of a circuit element formed on the portion having said predetermined high carrier density.

10. A semiconductor integrated circuit memory according to claim 1, wherein the circuit elements are formed on a GaAs substrate.

11. A semiconductor integrated circuit memory comprising:
a semi-insulating substrate;
a memory cell array part and a peripheral circuit part each formed of a multiplicity of circuit elements, the circuit elements being made of a first impurity-doped layer, the first impurity-doped layer being formed in the semi-insulating substrate at a multiplicity of positions, the memory cell array part including a plurality of memory cells arranged in the form of a matrix, and the peripheral circuit part selecting a desired one of the memory cells to perform read and write operations for the desired memory cell; and
a second impurity-doped layer formed under and between the circuit elements, the second impurity-doped layer being opposite in conductivity type to the first impurity-doped layer, the second impurity-doped layer being divided into at least first and second regions with the first region being formed under and between circuit elements of the memory cell array part and the second region being formed under and between circuit elements of the peripheral circuit part, the first and second regions being different in impurity concentration from each other.

12. A semiconductor integrated circuit memory according to claim 11, wherein the first region formed under and between the circuit elements of the memory cell array part has a predetermined high carrier density, and the second region formed under and between the circuit elements of the peripheral circuit part has a predetermined low carrier density.

13. A semiconductor integrated circuit memory according to claim 11, wherein the first impurity-doped layer for making the circuit elements is an N-type layer, and the second impurity-doped layer formed under and between the circuit elements is a P-type layer.

14. A semiconductor integrated circuit memory according to claim 13, wherein the P-type layer for the memory cell array part is formed through ion implantation techniques at a dosage greater than about $2 \times 10^{12}$ cm$^{-2}$, and the P-type layer for the peripheral circuit part is formed through ion implantation techniques at a dosage less than about $2 \times 10^{12}$ cm$^{-2}$.

15. A semiconductor integrated circuit memory according to claim 12, wherein at least one electrode is kept in ohmic contact with the first region, and the electrode is applied with an electric potential to control the threshold voltage of the circuit elements of the memory cell array part.

16. A semiconductor integrated circuit memory according to claim 11, wherein the second region formed under and between the circuit elements of the peripheral circuit part has a predetermined high in carrier density, wherein at least one electrode is kept in ohmic contact with the second region, and wherein the electrode is applied with a reverse bias potential to reduce the carrier density of the second region.

17. A semiconductor integrated circuit memory according to claim 11, wherein the second region formed under and between the circuit elements of the peripheral circuit part has a predetermined high carrier density in a portion having circuit elements arranged to form a flip-flop circuit, wherein at least one electrode is kept in ohmic contact with that portion of the second region having said predetermined high carrier density, and wherein the electrode is applied with an electric potential to control the threshold voltage of a circuit element formed on the portion having said predetermined high carrier density.

18. A semiconductor integrated circuit memory according to claim 11, wherein the first region formed under and between the circuit elements of the memory cell array part has a predetermined high carrier density in a portion having circuit elements arranged to form a flip-flop circuit, wherein at least one electrode is kept in ohmic contact with that portion of the first region having said predetermined high carrier density, and wherein the electrode is applied with an electric potential to control the threshold voltage of a circuit element formed on the portion having said predetermined high carrier density.

19. A semiconductor integrated circuit memory comprising:
a semi-insulating substrate;
a first region formed in the semi-insulating substrate and formed of an impurity-doped layer;
a second region formed in the semi-insulating substrate and formed of an impurity-doped layer different in impurity concentration from the impurity-doped layer for forming the first region;

a memory cell array part having a plurality of memory cells arranged in the form of a matrix, the memory cell array part being made up of a multiplicity of circuit elements, the circuit elements being made of an impurity-doped layer opposite in conductivity type to the first region, the impurity-doped layer being formed in the first region at a multiplicity of positions; and a peripheral circuit part for selecting a desired one of the memory cells to perform read and write operations for the desired memory cell, the peripheral circuit part being made up of a multiplicity of circuit elements, the circuit elements being made of an impurity-doped layer opposite in conductivity type to the second region, the impurity-doped layer being formed in the second region at a multiplicity of positions.

20. A semiconductor integrated circuit memory according to claim 19, wherein the first region has a predetermined high carrier density, and the second region has a predetermined low carrier density.

21. A semiconductor integrated circuit memory according to claim 19, wherein the impurity-doped layer for making the circuit elements is an N-type layer and each of the impurity-doped layers for forming the first and second regions is a P-type layer, and wherein the P-type layer for forming the first region is formed through ion implantation techniques at a dosage greater than about $2 \times 10^{12}$ cm$^{-2}$ and the P-type layer for forming the second region is formed through ion implantation techniques at a dosage less than about $2 \times 10^{12}$ cm$^{-2}$ 22. A semiconductor integrated circuit memory according to claim 19, wherein at least one electrode is kept in contact with the first region, and the electrode is applied with an electric potential to control the threshold voltage of the circuit elements of the memory cell array part.

23. A semiconductor integrated circuit memory according to claim 19, wherein the second region has a predetermined high carrier density, wherein at least one electrode is kept in ohmic contact with the second region, and wherein the electrode is applied with a reverse bias potential to reduce the carrier density of the second region.

24. A semiconductor integrated circuit memory according to claim 19, wherein the second region has a predetermined high carrier density in a portion having circuit elements arranged to form a flip-flop circuit, wherein at least one electrode is kept in ohmic contact with that portion of the second region having said predetermined high carrier density, and wherein the electrode is applied with an electric potential to control the threshold voltage of a circuit element formed on the portion having said predetermined high carrier density.

25. A semiconductor integrated circuit memory according to claim 19, wherein the first region has a predetermined high carrier density in a portion having circuit elements arranged to form a flip-flop circuit, wherein at least one electrode is kept in ohmic contact with that portion of the first region having said predetermined high carrier density, and wherein the electrode is applied with an electric potential to control the threshold voltage of a circuit element formed on the portion having said predetermined high carrier density.

* * * * *